(12) United States Patent
Peek et al.

(10) Patent No.: US 9,992,883 B2
(45) Date of Patent: Jun. 5, 2018

(54) CLASP ASSEMBLY AND DATA INTERCONNECTION FOR WEARABLE COMPUTING DEVICES

(71) Applicant: Intel Corporation, Santa Clara, CA (US)

(72) Inventors: Gregory A. Peek, North Plains, OR (US); Mark R. Francis, Portland, OR (US); Andy S. Idsinga, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/015,017

(22) Filed: Feb. 3, 2016

(65) Prior Publication Data

US 2016/0262275 A1 Sep. 8, 2016

Related U.S. Application Data

(63) Continuation of application No. 14/142,811, filed on Dec. 28, 2013, now Pat. No. 9,256,253.

(51) Int. Cl.
*G06F 1/16* (2006.01)
*H05K 5/00* (2006.01)
(Continued)

(52) U.S. Cl.
CPC ............. *H05K 5/0086* (2013.01); *G02B 6/42* (2013.01); *G06F 1/163* (2013.01); *G06F 1/1635* (2013.01);
(Continued)

(58) Field of Classification Search
CPC ....... G06F 1/163; G06F 1/1635; G06F 1/1684
See application file for complete search history.

(56) References Cited

U.S. PATENT DOCUMENTS

| 6,158,884 A | 12/2000 | Lebby et al. |
| 6,536,941 B1 | 3/2003 | Fang |

(Continued)

FOREIGN PATENT DOCUMENTS

| JP | 2009537287 | 10/2009 |
| JP | 2013544140 | 12/2013 |

(Continued)

OTHER PUBLICATIONS

International Search Report and Written Opinion of the International Searching Authority dated Mar. 12, 2015, in International Patent Application No. PCT/US2014/069393, 11 pages.

(Continued)

*Primary Examiner* — Anthony Q Edwards
(74) *Attorney, Agent, or Firm* — Womble Bond Dickinson (US) LLP (57) ABSTRACT

Embodiments of the invention describe a clasp assembly for detachably coupling a first housing to a second housing. The clasp assembly to further includes a data connector to provide an input/output (I/O) interface to a computing component of the first housing, and a data connector housing corresponding to the data connector, wherein the data connector is exposed when the clasp assembly is in an open position, and wherein the data connector is disposed in the data connector housing when the clasp assembly is in a closed position.

19 Claims, 6 Drawing Sheets

(51) Int. Cl.
*G02B 6/42* (2006.01)
*H01R 12/70* (2011.01)
*H01R 13/447* (2006.01)
*G02C 11/00* (2006.01)

(52) U.S. Cl.
CPC ....... *G06F 1/1684* (2013.01); *H01R 12/7076* (2013.01); *H01R 13/447* (2013.01); *G02C 11/10* (2013.01)

(56) References Cited

U.S. PATENT DOCUMENTS

| | | | |
|---|---|---|---|
| 7,450,107 | B2 | 11/2008 | Radley-Smith et al. |
| 7,455,525 | B2 * | 11/2008 | Rambosek ........... H05K 5/0278 439/131 |
| 7,581,833 | B2 | 9/2009 | Howell et al. |
| 7,809,412 | B2 | 10/2010 | Carlson |
| 8,040,758 | B1 | 10/2011 | Dickinson |
| 8,109,629 | B2 | 2/2012 | Howell |
| 8,971,023 | B2 | 3/2015 | Olsson |
| 9,256,253 | B2 * | 2/2016 | Peek ....................... G02B 6/42 |
| 2004/0203519 | A1 | 10/2004 | Pontoppidan et al. |
| 2005/0052834 | A1 | 3/2005 | Tanaka |
| 2005/0054395 | A1 | 3/2005 | Arbisi et al. |
| 2005/0237704 | A1 * | 10/2005 | Ceresoli ................. G06F 1/163 361/679.03 |
| 2005/0239502 | A1 | 10/2005 | Swab et al. |
| 2006/0012566 | A1 | 1/2006 | Siddeeq |
| 2006/0132382 | A1 | 6/2006 | Jannard |
| 2008/0291277 | A1 | 11/2008 | Jacobsen |
| 2009/0111286 | A1 * | 4/2009 | Giovannoni ..... G06K 19/07762 439/37 |
| 2013/0106603 | A1 * | 5/2013 | Weast ..................... G06F 1/163 340/539.11 |
| 2013/0176672 | A1 | 7/2013 | Richard et al. |
| 2014/0194702 | A1 | 7/2014 | Tran |
| 2014/0218852 | A1 | 8/2014 | Alcazar |
| 2015/0038204 | A1 | 2/2015 | Dugan et al. |
| 2015/0062790 | A1 * | 3/2015 | Eldershaw .............. G06F 1/163 361/679.03 |

FOREIGN PATENT DOCUMENTS

| | | |
|---|---|---|
| KR | 10-1999-0046393 | 7/1999 |
| KR | 10-2011-0130958 | 12/2011 |
| KR | 10-2013-0095326 | 8/2013 |
| KR | 20130111570 | 10/2013 |

OTHER PUBLICATIONS

International Search Report and Written Opinion of the International Searching Authority dated Mar. 16, 2015, in International Patent Application No. PCT/US2014/069151, 14 pages.
Notice of Allowance dated Feb. 2, 2016, in U.S. Appl. No. 14/142,602, 10 pages.
Notice of Allowance dated Oct. 5, 2015, in U.S. Appl. No. 14/142,811, 8 pages.
Office Action dated Aug. 18, 2015, in U.S. Appl. No. 14/142,602, 10 pages.
International Preliminary Report for PCT Application No. PCT/US2014/069393 dated Jul. 7, 2016, 7 pages.
International Preliminary Report for PCT Application No. PCT/US2014/069151 dated Jul. 7, 2016, 10 pages.
Japanese Appln. No. 2016-541492, Office Action, Dated May 9, 2017, 4 pgs.
Korean Application No. 2016-7014048, Notice of Preliminary Rejection, Dated May 23, 2017, 5 pgs.

* cited by examiner

CLASP ASSEMBLY AND DATA INTERCONNECTION FOR WEARABLE COMPUTING DEVICES

CROSS-REFERENCE TO RELATED APPLICATION

This application is a continuation of U.S. patent application Ser. No. 14/142,811, filed Dec. 28, 2013, which application is incorporated herein by reference in its entirety.

FIELD

Embodiments of the present invention generally pertain to computing devices and more specifically to wearable computing devices.

BACKGROUND

Wearable computing devices are electronic devices worn by a user. These devices may be worn differently by the user based on the device's intended function. For example, wearable computing devices to track a user's location or activity level may be worn similar to a bracelet, wristwatch or any other similar appropriate form factor. Heads up display (HUD) devices may have a form factor similar to a pair of eyeglasses.

One of the disadvantages of current wearable computing device design is that necessary power and input/output (I/O) interconnections are easily visible, and thus the device cannot completely have the equivalent aesthetic and form factor of a traditionally worn accessory. Furthermore, accessories such as bracelets and watches require some type of fastener (i.e., a clasp) for the user to put on or take off the accessory. This "break" in the wearable device often prevents interconnectivity and power from being provided throughout the device.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as a discussion of other potential embodiments or implementations of the inventive concepts presented herein. An overview of embodiments of the invention is provided below, followed by a more detailed description with reference to the drawings.

DETAILED DESCRIPTION

Embodiments of the invention describe concealed data interconnections for wearable computing devices. Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1A:
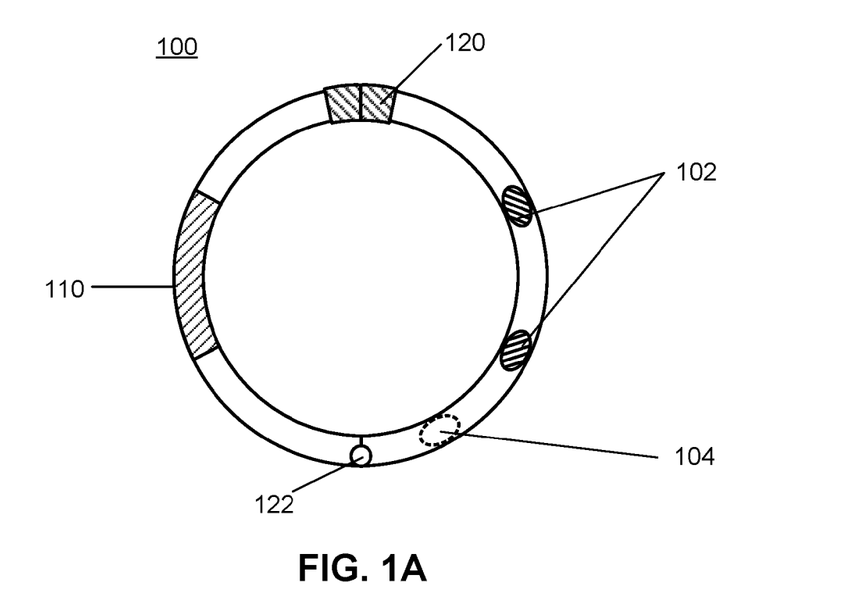
FIG. 1A and FIG. 1B are illustrations of a wearable computing device according to an embodiment of the invention.
Figure 1B:
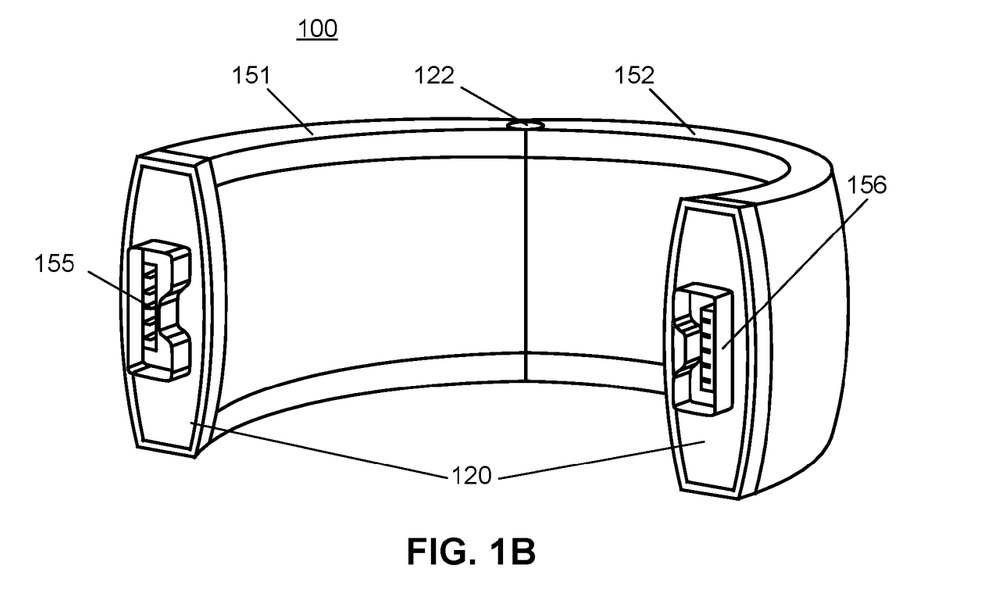

FIG. 1 and FIG. 1B are illustrations of a wearable computing device according to an embodiment of the invention. In this embodiment, wearable computing device 100 comprises a wearable band for wearing on a user's wrist, and may comprise any rigid or flexible material. This form factor may be used for several types of devices. For example, in some embodiments, the wearable computing device comprises a wristwatch form factor, having a display in place of a watch face, user input/output (I/O) components (or in some embodiments, the display comprises a touchscreen I/O interface), image sensors, audio output components, computing components such as memory, processor cores, network connectivity circuits, etc.

In this embodiment, device 100 comprises a bracelet form factor, and is described below as a user monitoring device. Said user monitoring device may be used for monitoring and storing data related to the user's activities and other health data.

In this embodiment, device 100 is illustrated in FIG. 1A to include biometric sensors 102 to contact the user's wrist for measuring physiological aspects of the user (e.g., the user's pulse). Device 100 further includes motion sensor 104 (e.g., an accelerometer or gyroscope) for tracking user movements. Device 100 may further include a location sensor to dynamically determine a location of the device/user. Device 100 is shown to further include power supply and computing components 110; said computing components may comprise memory, processor cores, network connectivity circuits, etc.

The above described sensors, power supply and computing components may be used to monitor and track user data such as activity-related data of the user (e.g., distance traveled and/or pace of the user, any activities related to sleeping, lying, sitting, and standing stationary), physiological data (e.g., heart rate and variability, respiration rate, body temperature), etc. This user data may be stored in the memory of computing components 110.

Device 100 is shown to further include clasp assembly 120 and hinge 122, to open and close the device to allow the user to put on and take off the device. FIG. 1A illustrates these components in a closed position. In prior art devices, access to a wearable device's power supply (e.g., for recharging) or computing components (i.e., to access memory contents) requires an external data connection port/plug, which affects the aesthetic appearance of a device (i.e., the device looks less like an accessory and more like a computing device).

In this embodiment, data connector plug 155, shown to be disposed within clasp assembly 120 (as shown in FIG. 1B, wherein the clasp assembly is in an open state), is provided to enable access to power and computing components 110—i.e., data and power signals that allow device 100 to connect to external components (i.e., for providing access to the memory of the device, or for charging the device). The data connector plug is therefore accessible when the clasp assembly is in an open state as shown in FIG. 1B, and concealed to not affect the aesthetic appearance of device 100 when the clasp assembly is closed as shown in FIG. 1A. Said clasp assembly may further protect data connector plug 155 from external elements, such as contaminants and moisture.

Clasp assembly 120 and hinge 122 thus separate device 100 into two members—first member 151 (including the above described power and computing components) and second member 152 (including the above described sensors). Prior art devices either require interconnecting wires to run through these open connections, or require connections to be routed through the entire device.

In this embodiment, these separate members are to utilize an interconnection to exchange data and power (i.e., for sensors 102 and 104 to receive power from and transmit sensor data to power and computing components 110). In this embodiment, clasp assembly 120 is shown to further conceal hidden data connector port 156, which corresponds to data connector plug 155 (plug 155 and port 156 may alternatively be referred to herein as mating connectors or male/female electrical connectors). In other embodiments, first member 151 of device 100 may include a data connector port, while second member 152 includes the corresponding data connector plug.

Thus, plug 155 and port 156, coupled together and concealed by clasp assembly 120 in a closed state, allow separate members 151 and 152 to be communicatively and electrically coupled together. In this embodiment, second member 152 is not powered up when clasp assembly 120 is in an open state.

Figure 1C:
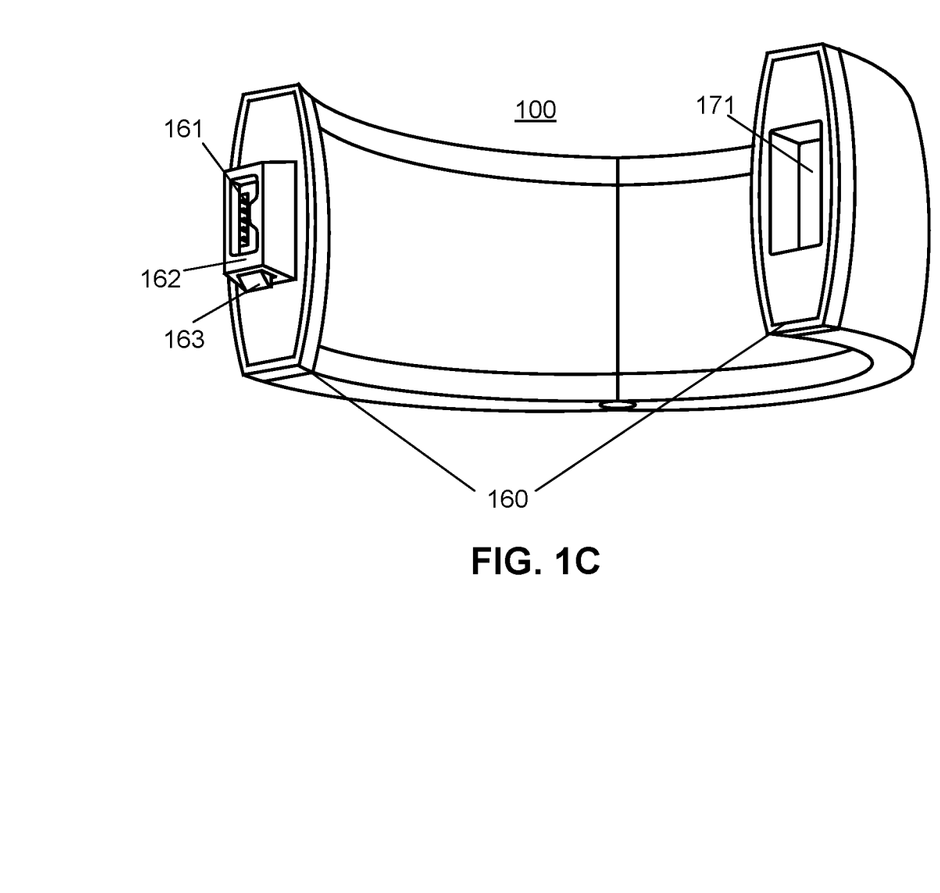
FIG. 1C is an illustration of a clasp assembly for a wearable computing device according to an embodiment of the invention.

While the above embodiment describes a clasp assembly having both a data plug and a mated data port, other embodiments may utilize a (male) data plug only or a (female) data port only. FIG. 1C illustrates an alternative clasp assembly for device 100. Clasp assembly 160 is shown to be in an open state, and includes (female) data port 161 and corresponding recessed enclosure 171. In this embodiment, data port 161 is included in raised structure 162 (i.e., the male side of clasp assembly 160), and is placed in corresponding recessed enclosure 171 (i.e., the female side of clasp assembly 160) when the clasp assembly is in a closed state (hooks 163 slide up and under recessed side portions of enclosure 171 to secure the clasp assembly in the closed state). Thus, the clasp assembly in this embodiment conceals a (female) data port, and does not include a corresponding (male) data plug; the data port may be exposed when the clasp assembly is open for the user to access the computing components of device 100 (e.g., via a device or cable including the data plug connector corresponding to data port 161).

The above described data connectors and data ports may be consistent with any data connector known in the art, such as a High-Definition Multimedia Interface (HDMI) connector, a Universal Serial Bus (USB) connector, a FireWire connector, a Digital Visual Interface (DVI) connector, Mini DisplayPort Connector, a Mobile High-Definition Link (MHL) connector, a Small Computer System Interface (SCSI) connector, or a Thunderbolt connector. Furthermore, in some embodiments, the data connectors may comprise optical connectors, and the clasp assembly may include features to align the optical connectors.

Embodiments of the invention thus describe a clasp assembly to couple first and second members of a housing of a wearable computing device, and to conceal a data connector port/plug for accessing power and/or computing components of the device. While the above described embodiment pertains to form factors for wearing on a user's wrist, other embodiments may utilize different form factors.

Figure 2A:
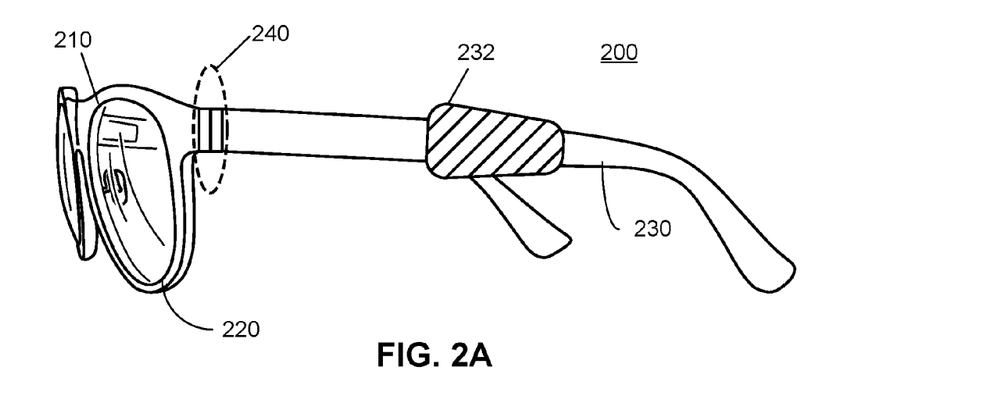
FIG. 2A and FIG. 2B are illustrations of a wearable computing device according to an embodiment of the invention.
Figure 2B:
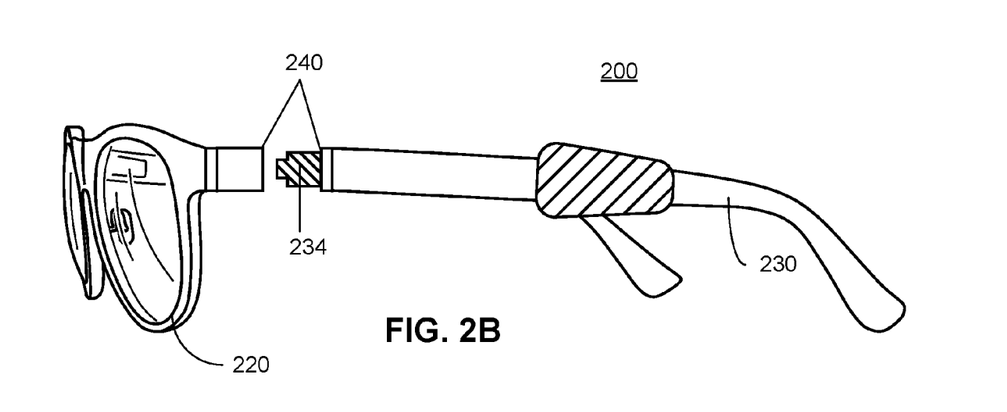

FIG. 2A and FIG. 2B are illustrations of a wearable computing device according to an embodiment of the invention. In this embodiment, device 200 comprises a head mounted display device having a form factor similar to a pair of eyeglasses to be worn on or about the head. Device 200 may be capable of displaying only a computer generated image to the user (i.e., a virtual reality (VR) device), or may be capable of superimposing computer generated images over a real-world view (i.e., an augmented reality (AR) device).

Device 200 comprises eyeglass housing frame 210, which may be formed from any solid material (e.g., plastic or metal) and is shown to include lens frame member 220 and extending side-arm member 230. Lens frame member 220 may include image display components (and additional suitable components, such as image or audio capture sensors), while extending side-arm member 230 includes power supply and computing components 232; said computing components may comprise memory, processor cores, network connectivity circuits, etc.

In this embodiment, data connector plug 234 is shown to be disposed within clasp assembly 240 (concealed when the clasp assembly is in a closed state, as shown in FIG. 2A, and accessible when the clasp assembly is in an open state, as shown in FIG. 2B). In this embodiment, said clasp assembly completely disconnects side-arm member 230 from lens frame member 220; in other embodiments, said members may remain connected via a hinge assembly.

Data connector plug 234 is provided to enable access to power and computing components 232—i.e., data and power signals that allow device 200 to connect to external components (i.e., for providing access to the memory of the device, or for charging the device). The data connector plug is therefore accessible when clasp assembly 240 is in an opened state, and concealed to not affect the aesthetic appearance of device 200 when the clasp assembly is closed. Said clasp assembly may further protect data connector plug 234 from external elements, such as contaminants and moisture.

In this embodiment, clasp assembly 240 further conceals a hidden data connector port in lens frame member 220, which corresponds to data connector plug 234 (the plug and port location may alternatively be switched). Thus, said mated plug and port, connected and concealed by clasp assembly 240 in a closed state, allow eyeglass frame members 220 and 230 and their respective components to be communicatively and electrically coupled together. In this embodiment, lens frame member 220, and its optical display system, are not powered up when clasp assembly 240 is in an open state and side-arm member 230 is disconnected.

Figure 3A:
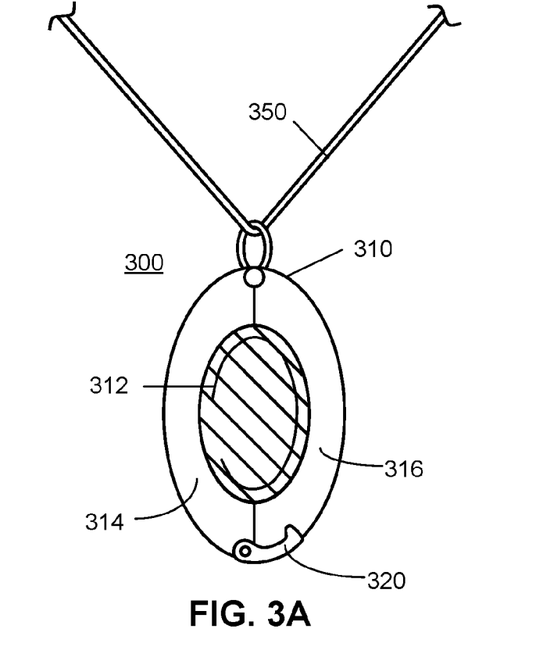
FIG. 3A and FIG. 3B are illustrations of a wearable computing device according to an embodiment of the invention.
Figure 3B:
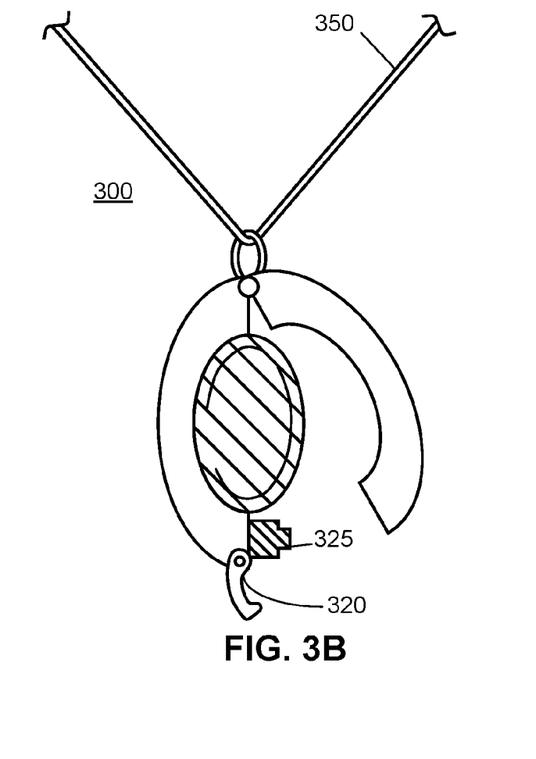

FIG. 3A and FIG. 3B are illustrations of a wearable computing device according to an embodiment of the invention. In this embodiment, device 300 comprises a pendant including frame 310 supportable by necklace 350 to be worn by a user. Wearable computing device 300 may comprise any type of device suitable for this exemplary form fact; in this example, device 300 is described as a pedometer, which may include an acceleration sensor to collect acceleration data used for detecting the user's steps, and power and computing components to process and store the sensor data. Device 300 is shown to include component 312, which may comprise a display for displaying related data, or may comprise an ornamental component (e.g., a gemstone). Frame 310 is further shown to include first and second members 314 and 316 (wherein first member 314 is to include the sensor and computing components).

In this embodiment, the reduced form factor of device 300 does not allow for placement of a data accessible plug or port on an external portion of the device. In this embodiment, raised structure 325 may comprise a data connector plug or a raised data connector port (i.e., similar to port 161 of FIG. 1C) and is shown to be concealed within clasp assembly 320 when in a closed state (as shown in FIG. 3A) and accessible when said clasp assembly is in an open state (as shown in FIG. 3B). The data connector plug is provided to enable access to the power and computing components of the device—i.e., data and power signals that allow device 300 to connect to external components (i.e., for providing access to the memory of the device, or for charging the device). Data connector structure 325 is therefore accessible when the clasp assembly is open, and concealed to not affect the aesthetic appearance of device 300 when the clasp assembly is closed. Said clasp assembly may further protect data connector structure 325 from external elements, such as contaminants and moisture. In contrast to the other exemplary embodiments discussed above, second member 318 does not include any electrical or computing components, and therefore simply includes a housing for structure 325 when clasp assembly 320 is in a closed position.

Figure 4:
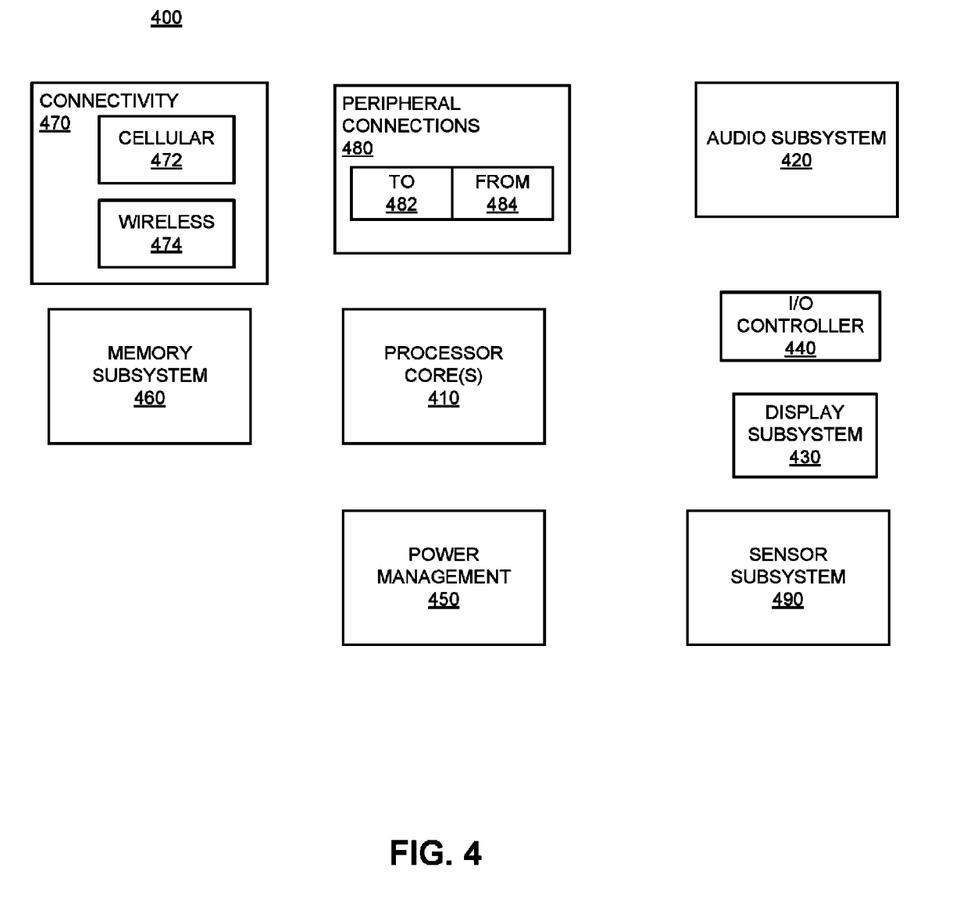
FIG. 4 is a block diagram of computing components of a wearable computing device according to an embodiment of the invention.

FIG. 4 is a block diagram of computing components of a wearable computing device according to an embodiment of the invention. It will be understood that certain of the components are shown generally, and not all components of such a device are shown in device 400. Furthermore, it will be understood that any of the illustrated components may be discrete components or may be components included on a system on a chip (SoC) integrated circuit (IC), and may be communicatively coupled through any direct or indirect means.

Device 400 includes one or more processor cores 410, which performs the primary processing operations of device 400. Each of processor core(s) 410 can be SoC components, or can be included in one or more physical devices, such as single or multi-core microprocessors, application processors, microcontrollers, programmable logic devices, or other processing means. The processing operations performed by processor core(s) 410 include the execution of an operating platform or operating system on which applications and/or device functions are executed. The processing operations include operations related to I/O (input/output) with a human user or with other devices, operations related to power management, and/or operations related to connecting device 400 to another device. The processing operations may also include operations related to audio I/O and/or display I/O.

In one embodiment, device 400 includes audio subsystem 420, which represents hardware (e.g., audio hardware and audio circuits) and software (e.g., drivers, codecs) components associated with providing audio functions to the computing device. Audio functions can include speaker and/or headphone output, as well as microphone input via any of the audio jacks described above. Devices for such functions can be integrated into device 400, or connected to device 400. In one embodiment, a user interacts with device 400 by providing audio commands that are received and processed by processor core(s) 410.

I/O controller 440 represents hardware devices and software components related to interaction with a user. I/O controller 440 can operate to manage hardware that is part of audio subsystem 420 and/or display subsystem 430. Additionally, I/O controller 440 illustrates a connection point for additional devices that connect to device 400 through which a user might interact with the system. For example, devices that can be attached to device 400 might include microphone devices, speaker or stereo systems, video systems or other display device, keyboard or keypad devices, or other I/O devices for use with specific applications such as card readers or other devices.

As mentioned above, I/O controller 440 can interact with audio subsystem 420 and/or display subsystem 430. For example, input through a microphone or other audio device can provide input or commands for one or more applications or functions of device 400. Additionally, audio output can be provided instead of or in addition to display output. Display subsystem 430 includes a touchscreen, and thus the display device also acts as an input device, which can be at least partially managed by I/O controller 440. There can also be additional buttons or switches on device 400 to provide I/O functions managed by I/O controller 440. Sensor subsystem 490 may comprise any touch sensor (e.g., touch sensors in addition to the touchscreen of display subsystem 430) and/or motion detectors suitable for the wearable computing devices described above.

In one embodiment, I/O controller 440 manages devices such as accelerometers, cameras, light sensors or other environmental sensors, or other hardware that can be included in device 400. The input can be part of direct user interaction, as well as providing environmental input to the system to influence its operations (such as filtering for noise, adjusting displays for brightness detection, applying a flash for a camera, or other features). In one embodiment, device 400 includes power management 450 that manages battery power usage, charging of the battery, and features related to power saving operation.

Memory subsystem 460 includes memory devices for storing information in device 400. Memory can include nonvolatile (state does not change if power to the memory device is interrupted) and/or volatile (state is indeterminate if power to the memory device is interrupted) memory devices. Memory 460 can store application data, user data, music, photos, documents, or other data, as well as system data (whether long-term or temporary) related to the execution of the applications and functions of system 400. Memory 460 further stores firmware images related to boot path operations, and thus may include DRAM devices to store said firmware images as described above.

Connectivity 470 includes hardware devices (e.g., wireless and/or wired connectors and communication hardware) and software components (e.g., drivers, protocol stacks) to enable device 400 to communicate with external devices. The device could be separate devices, such as other computing devices, wireless access points or base stations, as well as peripherals such as headsets, printers, or other devices.

Connectivity 470 can include multiple different types of connectivity. To generalize, device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 474 refers to wireless connectivity that is not cellular, and can include personal area networks (such as Bluetooth), local area networks (such as Wi-Fi), and/or wide area networks (such as Wi-Max), or other wireless communication.

Peripheral connections 480 include hardware interfaces and connectors for implementing non-flash firmware storage support as described above, as well as software components (e.g., drivers, protocol stacks) to make peripheral connections. It will be understood that device 400 could both be a peripheral device ("to" 482) to other computing devices, as well as have peripheral devices ("from" 484) connected to it.

Device 400 may have a "docking" connector to connect to other computing devices for purposes such as managing (e.g., downloading and/or uploading, changing, synchronizing) content on device 400. Additionally, a docking connector can allow device 400 to connect to certain peripherals that allow device 400 to control content output, for example, to audiovisual or other systems. In addition to a proprietary docking connector or other proprietary connection hardware, device 400 can make peripheral connections 480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type. These connectors may be concealed by the clasp assemblies for the wearable computing devices described above.

Figure 5:
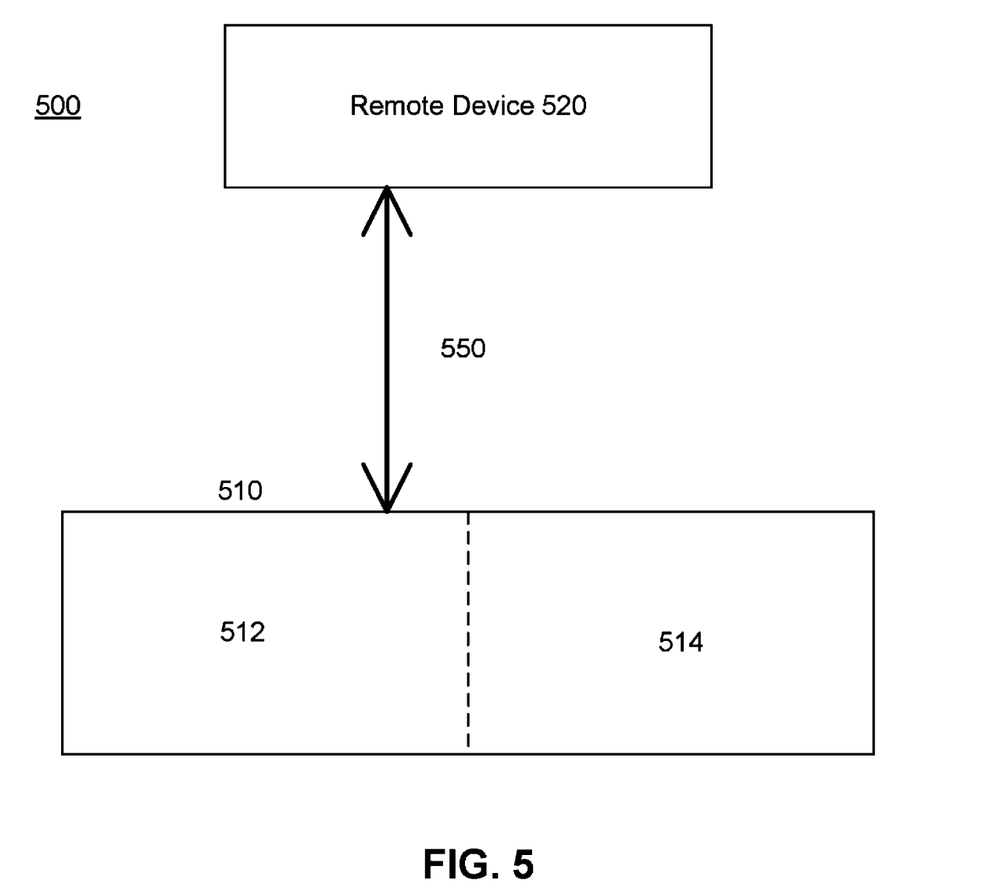
FIG. 5 illustrates a wearable computing device communicatively coupled to a remote device according to an embodiment of the invention.

FIG. 5 illustrates a wearable computing device communicatively coupled to a remote device according to an embodiment of the invention. System 500 includes wearable computing device 510 and remote device 520 communicatively coupled via communication link 550. Link 550 may comprise a wired or wireless connection. Wearable computing device 510 is shown to comprise two sections—512 and 514, which may be detachably coupled via any of the clasp assembly means described above.

Wearable computing device 510 may comprise any of the described or inferred embodiments discussed above. Remote device 520 may exchange data with device 510 via link 550. In embodiments where link 550 is not a wireless connection, remote device 520 may be communicatively coupled to device 510 via a concealable data connector included in section 512.

Remote device 520 may comprise any type of computing device or transmitter including a laptop computer, a mobile telephone, etc., that is configured to exchange data with wearable device 510. Remote device 520 and device 510 may each contain hardware to enable communication link 540, such as processors, transmitters, receivers, antennas, etc.

For example, communication link 550 may comprise a wired link via a serial bus such as a universal serial bus or a parallel bus; communication link 550 may also comprise a wireless connection using, e.g., Bluetooth® radio technology, communication protocols described in IEEE 802.11 (including any IEEE 802.11 revisions), Cellular technology (such as GSM, CDMA, UMTS, EV-DO, WiMAX, or LTE), or among other possibilities.

Various components referred to above as processes, servers, or tools described herein may be a means for performing the functions described. Each component described herein includes software or hardware, or a combination of these. Each and all components may be implemented as logic such as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

Embodiments of the invention may describe devices including a clasp assembly for detachably coupling a first housing to a second housing, the clasp assembly to further include a data connector to provide an input/output (I/O) interface to a computing component of the first housing, and a data connector housing corresponding to the data connector, wherein the data connector is exposed when the clasp assembly is in an open position, and wherein the data connector is disposed in the data connector housing when the clasp assembly is in a closed position.

In some embodiments, the data connector of the clasp assembly comprises a data connector plug. In some embodiments, the data connector of the clasp assembly comprises a data connector port.

In some embodiments, data connector housing of the clasp assembly comprises a second data connector, mated to the data connector, to communicatively couple a computing component of the second member to the computing component of the first member. In some of these embodiments, the second data connector further enables power to be transferred from the first member; for example, the computing component of the second housing is disabled when the clasp assembly is in the open position. In some of these embodiments, the computing component of the second housing comprises at least one of a display or a user input/output (I/O) interface.

In some of these embodiments, the first and second data connectors of the clasp assembly comprise first and second optical connectors, respectively, and the data connector housing of the clasp assembly further optically aligns the first and second optical connectors.

In some embodiments, the data connector of the clasp assembly comprises at least one of a High-Definition Multimedia Interface (HDMI) connector, a Universal Serial Bus (USB) connector, a FireWire connector, a Digital Visual Interface (DVI) connector, Mini DisplayPort Connector, a Mobile High-Definition Link (MHL) connector, or a Thunderbolt connector. In some embodiments, the data connector housing of the clasp assembly comprises a cover to enclose the data connector.

Embodiments of the invention may describe a mobile system comprising a computing component, a first housing including the computing component, a second housing, and a clasp assembly for detachably coupling the first housing to the second housing. The clasp assembly to further include a data connector to provide an input/output (I/O) interface to the computing component included in the first housing, and a data connector housing corresponding to the data connector, wherein the data connector is exposed when the clasp assembly is in an open position, and wherein the data connector is disposed in the data connector housing when the clasp assembly is in a closed position.

In some embodiments, the data connector of the clasp assembly comprises a data connector plug. In some embodiments, the data connector of the clasp assembly comprises a data connector port.

In some embodiments, data connector housing of the clasp assembly comprises a second data connector, mated to the data connector, to communicatively couple a second computing component included the second member to the computing component included in the first member. In some of these embodiments, the second data connector further enables power to be transferred from the first member, and the second computing component included in the second housing is disabled when the clasp assembly is in the open position. In other embodiments, the first and second data connectors of the clasp assembly comprise first and second optical connectors, respectively, and the data connector housing of the clasp assembly further optically aligns the first and second optical connectors. In some embodiments, the data connector housing of the clasp assembly comprises a cover to enclose the data connector.

In some embodiments, the mobile system comprises a wearable computing device, and the clasp assembly is included in a wearable band for wearing on a wrist of a user. In other embodiments, the mobile system comprises an optical head mounted display, and the clasp assembly is included in an eyeglass frame assembly. In other embodiments, the mobile system comprises a wearable computing device, and the clasp assembly is included in a pendant supportable by a necklace worn by a user.

Embodiments of the invention may describe devices for detachably coupling two or more housings, including a clasp assembly for detachably coupling a first housing to a second housing, the clasp assembly to further include a data connector to provide an input/output (I/O) interface to a computing component of the first housing, and a data connector housing corresponding to the data connector, wherein the data connector is exposed when the clasp assembly is in an open position, and wherein the data connector is disposed in the data connector housing when the clasp assembly is in a closed position.

Embodiments of the invention may describe a mobile system having two or more detachably coupled housings comprising a computing component, a first housing including the computing component, a second housing, and a clasp assembly for detachably coupling the first housing to the second housing. The clasp assembly to further include a data connector to provide an input/output (I/O) interface to the computing component included in the first housing, and a data connector housing corresponding to the data connector, wherein the data connector is exposed when the clasp assembly is in an open position, and wherein the data connector is disposed in the data connector housing when the clasp assembly is in a closed position.

The invention claimed is:

1. A wearable computing device comprising:
   a computing component;
   a power supply; and
   a wearable band, the wearable band including a first member and a second member with a separation point preventing an electrical connection between the first member and second member, the first member including at least the computing component and the power supply, and a clasp assembly for opening and closing the wearable band, the clasp assembly further including a data connector, the data connector to provide access both to the power supply to charge the wearable computing device and to the computing component to access data in memory of the wearable computing device included in the first member;
   wherein the data connector is accessible when the clasp assembly is in an open state and is concealed when the data connector is in a closed state, and wherein the second member of the wearable computing device does not receive power when the clasp assembly is in the open state.

2. The wearable computing device of claim 1, wherein the data connector of the clasp assembly comprises a data connector plug.

3. The wearable computing device of claim 1, wherein the data connector of the clasp assembly comprises a data connector port.

4. The wearable computing device of claim 1, further comprising at least one of a display or a user input/output (I/O) interface for the computing component.

5. The wearable computing device of claim 1, wherein the data connector of the clasp assembly comprises at least one of a High-Definition Multimedia Interface (HDMI) connector, a Universal Serial Bus (USB) connector, a FireWire connector, a Digital Visual Interface (DVI) connector, Mini DisplayPort Connector, a Mobile High-Definition Link (MHL) connector, or a Thunderbolt connector.

6. The wearable computing device of claim 1, wherein the clasp assembly comprises a cover to enclose the data connector.

7. The wearable computing device of claim 1, wherein the separation point is a hinge.

8. The wearable computing device of claim 1, wherein the second member includes one or more sensors.

9. A wearable mobile system comprising:
   a computing component;
   a power supply;
   a display device to display data from the computing component;
   a biometric sensor;
   a wearable wrist band including a first member and a second member with a separation point preventing an electrical connection between the first member and the second member, the first member including at least the computing component and power supply and the second member including at least the biometric sensor, and a clasp assembly;
wherein the clasp assembly is for opening and closing the wearable wrist band, the clasp assembly to further include:
a data connector to provide access both to power supply to charge the wearable mobile system and to the computing component to access data in memory of the wearable computing device included in the first member;
wherein the data connector is accessible when the clasp assembly is in an open position, and wherein the data connector is concealed when the clasp assembly is in a closed position, and wherein the second member of the wearable computing device does not receive power when the clasp assembly is in the open state.

10. The wearable mobile system of claim 9, wherein the data connector of the clasp assembly comprises a data connector plug.

11. The wearable mobile system of claim 9, wherein the data connector of the clasp assembly comprises a data connector port.

12. The wearable mobile system of claim 9, wherein the data connector housing of the clasp assembly comprises a cover to enclose the data connector.

13. The wearable mobile system of claim 9, wherein the display device is coupled with the wearable wrist band.

14. The wearable mobile system of claim 9, wherein the computing component is to track activity-related data for a user of the wearable mobile system.

15. The wearable mobile system of claim 9, wherein the clasp assembly is to open and close the wrist band to allow a user to put on and take off the device.

16. The wearable mobile system of claim 15, wherein the wearable band includes flexible material.

17. The wearable mobile system of claim 9, further comprising one or more of a motion sensor to track movements of a user, or a location sensor to dynamically determine a location of the device.

18. The wearable mobile system of claim 9, wherein the clasp assembly is to protect the data connector from external elements.

19. The wearable mobile system of claim 9, wherein the separation point is a hinge.

* * * * *